United States Patent
Kwon et al.

(10) Patent No.: US 7,939,947 B2
(45) Date of Patent: May 10, 2011

(54) SEMICONDUCTOR PACKAGE STRUCTURE

(75) Inventors: Yong-Chai Kwon, Gyeonggi-do (KR); Dong-Ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/769,232

(22) Filed: Apr. 28, 2010

(65) Prior Publication Data

US 2010/0207278 A1 Aug. 19, 2010

Related U.S. Application Data

(62) Division of application No. 11/866,942, filed on Oct. 3, 2007, now Pat. No. 7,732,328.

(30) Foreign Application Priority Data

Oct. 3, 2006 (KR) .......................... 10-2006-0097474

(51) Int. Cl.
*H01L 23/48* (2006.01)
*H01L 23/52* (2006.01)

(52) U.S. Cl. .. 257/777; 257/686; 257/774; 257/E23.145

(58) Field of Classification Search .................. 257/777, 257/774, 686, 786, E23.145
See application file for complete search history.

(56) References Cited

U.S. PATENT DOCUMENTS

| | | | |
|---|---|---|---|
| 5,682,062 A | 10/1997 | Gaul | |
| 6,239,495 B1 | 5/2001 | Sakui et al. | |
| 6,577,013 B1 | 6/2003 | Glenn et al. | |
| 6,608,371 B2 | 8/2003 | Kurashima et al. | |
| 6,624,506 B2 | 9/2003 | Sasaki et al. | |
| 6,740,964 B2 * | 5/2004 | Sasaki | 257/687 |
| 7,129,567 B2 | 10/2006 | Kirby et al. | |
| 7,180,149 B2 | 2/2007 | Yamamoto et al. | |
| 7,276,799 B2 | 10/2007 | Lee et al. | |
| 7,327,592 B2 | 2/2008 | Silvestri | |
| 7,544,538 B2 * | 6/2009 | Chung et al. | 438/106 |
| 7,550,835 B2 * | 6/2009 | Kang | 257/686 |
| 7,560,304 B2 * | 7/2009 | Takiar et al. | 438/107 |
| 7,605,019 B2 * | 10/2009 | Simon et al. | 438/109 |
| 7,671,459 B2 * | 3/2010 | Corisis et al. | 257/686 |
| 7,700,957 B2 * | 4/2010 | Bieck et al. | 257/82 |
| 7,791,191 B2 * | 9/2010 | Takiar et al. | 257/723 |
| 2004/0124520 A1 * | 7/2004 | Rinne | 257/686 |
| 2006/0019484 A1 * | 1/2006 | Chen et al. | 438/618 |
| 2007/0235851 A1 | 10/2007 | Ware et al. | |
| 2007/0284729 A1 | 12/2007 | Kwon et al. | |

FOREIGN PATENT DOCUMENTS

JP 2001-307057 11/2001

(Continued)

*Primary Examiner* — Nitin Parekh
(74) *Attorney, Agent, or Firm* — Myers Bigel Sibley & Sajovec, P.A.

(57) ABSTRACT

A semiconductor package structure is disclosed. The semiconductor package structure includes semiconductor chips on a semiconductor substrate. Each of the semiconductor chips includes chip pads. Through-vias extend through each of the semiconductor chips. Redistribution structures and a chip selection interconnection line are disposed on each of the semiconductor chips. The redistribution structures electrically connect at least one of the through-vias with at least one of the chip pads. Each chip selection interconnection line includes first regions connected to a corresponding number of the through-vias and a second region connecting at least one of the first regions with one of the chip pads. The semiconductor chips are stacked and electrically connected using the through-vias.

7 Claims, 11 Drawing Sheets

FOREIGN PATENT DOCUMENTS

| | | |
|---|---|---|
| JP | 2003-282816 | 10/2003 |
| JP | 2004-221372 | 8/2004 |
| KR | 10-2001-0098740 | 11/2001 |
| KR | 2002-0039012 | 5/2002 |
| KR | 2002-0039014 | 5/2002 |

* cited by examiner

SEMICONDUCTOR PACKAGE STRUCTURE

CLAIM OF PRIORITY

The present application is a divisional of and claims priority from U.S. patent application Ser. No. 11/866,942, filed Oct. 3, 2007 now U.S. Pat. No. 7,732,328, which claims the benefit of Korean Patent Application No. 10-2006-0097474, filed on Oct. 3, 2006, the disclosures of which are hereby incorporated by reference herein in their entireties.

BACKGROUND

1. Field of Invention

Embodiments of the present invention generally relate to semiconductor package structures and methods of fabricating the same. More particularly, embodiments of the present invention relate to a semiconductor package structure and a method of fabricating the same which facilitates changing the design of a structure of a chip selection unit.

2. Description of the Related Art

A semiconductor fabrication process includes a front-end process for fabricating integrated circuit (IC) chips on a wafer using photolithography, deposition, and etching processes and a back-end process for assembling and packaging the respective IC chips. Four significant functions of the packaging process are as follows:

1. Protection of the IC chips from environment and handling damage.
2. Formation of interconnection lines used to transmit input/output signals from/to the IC chips.
3. Physical support of the IC chips.
4. Dissipation of heat from the IC chips.

In addition, with an increase in the integration density of semiconductor devices and the spread of portable electronic devices, improved properties (e.g., enhancement of electrical performance and reductions of cost, weight and thickness) are being demanded. In order to satisfy these technical requirements, a Package on Package (PoP), a chip-scale package (CSP), and a wafer-level package (WLP) have been recently developed. Particularly, a PoP technique for electrically connecting stacked chips using through-vias is being expected as a technique suitable for providing high performance and a small form factor. Meanwhile, a PoP including through-vias requires a chip selection unit to select a predetermined chip because the through-vias are interconnection lines shared among a plurality of chips.

FIGS. 1 and 2 are plan and perspective views, respectively, of a conventional PoP having a chip selection unit.

Referring to FIGS. 1 and 2, a plurality of semiconductor chips C1, C2, C3, and C4, each including an internal circuit, are stacked. The semiconductor chips C1 to C4 include chip pads 20 connected to internal circuits, redistribution structures 30 connected to the chip pads 20, and through-vias 10 formed through the semiconductor chips C1 to C4. The through-vias 10 are formed in an outer portion of each of the semiconductor chips C1 to C4 and electrically connect the semiconductor chips C1 to C4 in a vertical direction. Thus, the through-vias 10 are stacked in a vertical direction with respect to the top surfaces of the semiconductor chips C1 to C4 and are used to form a vertical interconnection line of the PoP.

The through-vias 10 are electrically connected to the chip pads 20 and the internal circuits through the redistribution structures 30. Thus, internal circuits of the semiconductor chips C1 to C4 are commonly connected in parallel to the vertical interconnection line consisting of the stacked through-vias 10. Therefore, chip selection units 90 are required to selectively operate a predetermined semiconductor chip as described above.

According to the conventional art, each of the chip selection units 90 includes chip selection vias 11 to 14, a chip selection pad 25 connected to a chip selection circuit used for selecting a chip, and a chip selection line 31, 32, 33, or 34 used for connecting one of the chip selection vias 11 to 14 and the chip selection pad 25. Accordingly, the chip selection vias 11 to 14 are formed using the same process as the through-vias 10, the chip selection pad 25 is formed using the same process as the chip pads 20, and the chip selection lines 31 to 34 are formed using the same process as the redistribution structures 30. Also, each chip selection line 31 to 34 has a different structure according to the stacked order of the corresponding one of the semiconductor chips C1 to C4, as shown in FIGS. 1 and 2. For example, the chip selection line 31 of the first semiconductor chip C1 is connected only to the first chip selection via 11 and the chip selection line 32 of the second semiconductor chip C2 is connected only to the second chip selection via 12. As a result, each of the chip selection units 90 has a different structure according to the stacked order of the corresponding one of the semiconductor chips C1 to C4.

According to the conventional art, the structure of each of the chip selection units 90 is determined in a chip designing process. Specifically, each of the chip selection lines 31 to 34 and the redistribution structure 30 are formed using a different photo mask as an etch mask according to the stacked order of the corresponding one of the semiconductor chips C1 to C4. However, determining the structure of each of the chip selection units 90 in the chip designing process tends to deteriorate the flexibility of the packaging process. As a result, it is not easy to change the chip designing process for various reasons. For example, when a semiconductor chip connected to a predetermined chip selection via is added, the chip selection units 90 of all the semiconductor chips C1 to C4 need to be changed because of fixed structures of the chip selection units 90. However, to change of the chip selection units 90, photo masks used to form the redistribution structures 30 must also be changed. As a result, the cost and time associated with fabricating a PoP may be undesirably increased.

Furthermore, even if the semiconductor chips C1 to C4 are of the same configuration, the stacked order of the semiconductor chips C1 to C4 cannot be arbitrarily changed due to the fixed structures of the chip selection units 90. Thus, in the event that there is a supply shortage of a particular semiconductor chip, shipment of PoP devices incorporating the particular semiconductor chip may be delayed.

SUMMARY

The present invention provides a semiconductor package structure that can easily change the structure of a chip selection unit. Also, the present invention provides a method of fabricating a semiconductor package structure that can improve the flexibility of the structure of a chip selection unit.

One embodiment exemplarily described herein can be characterized as a method of forming a semiconductor device that includes providing semiconductor chips wherein each semiconductor chip includes chip pads. Through-vias are formed to extend through each of the semiconductor chips. Redistribution structures and a chip selection interconnection layer are formed on each of the semiconductor chips, wherein the redistribution layers and chip selection interconnection layer connect through-vias with chip pads on each of the semiconductor chips. The chip selection interconnection layer on each of the semiconductor chips is patterned to form chip selection interconnection lines on each of the semiconductor chips, wherein a structure of a chip selection interconnection line on one of the semiconductor chips is different from a structure of a chip selection interconnection line on another one of the semiconductor chips. The semiconductor chips are stacked such that the stacked semiconductor chips are electrically connected to one another by the through-vias.

Another embodiment exemplarily described herein can be characterized as a semiconductor package that includes stacked semiconductor chips each including chip pads connected to an internal circuit. Through-vias extend through each of the semiconductor chips. Redistribution structures are disposed on each of the semiconductor chips such that at least one of the redistribution structures electrically connects at least one of the chip pads with at least one of the through-vias. A chip selection interconnection line is disposed on each of the semiconductor chips. Each chip selection interconnection line may include first regions connected to a corresponding number of the through-vias and a second region connecting at least one of the first regions with a predetermined one of the chip pads. At least one of the first regions is not electrically connected to the predetermined one of the chip pads.

BRIEF DESCRIPTION OF THE DRAWINGS

The accompanying drawings, which are included to provide a further understanding of the embodiments described herein and are incorporated in and constitute a part of this application, illustrate embodiment(s) of the present invention and together with the description serve to explain the principle of the invention. In the drawings:

FIGS. 3A through 5A are plan views illustrating an exemplary method of manufacturing a semiconductor package structure according to one embodiment;

FIGS. 3B through 5B are perspective views of the exemplary method of manufacturing the semiconductor package structure shown in FIGS. 3A through 5A;

DETAILED DESCRIPTION

Figure 1:
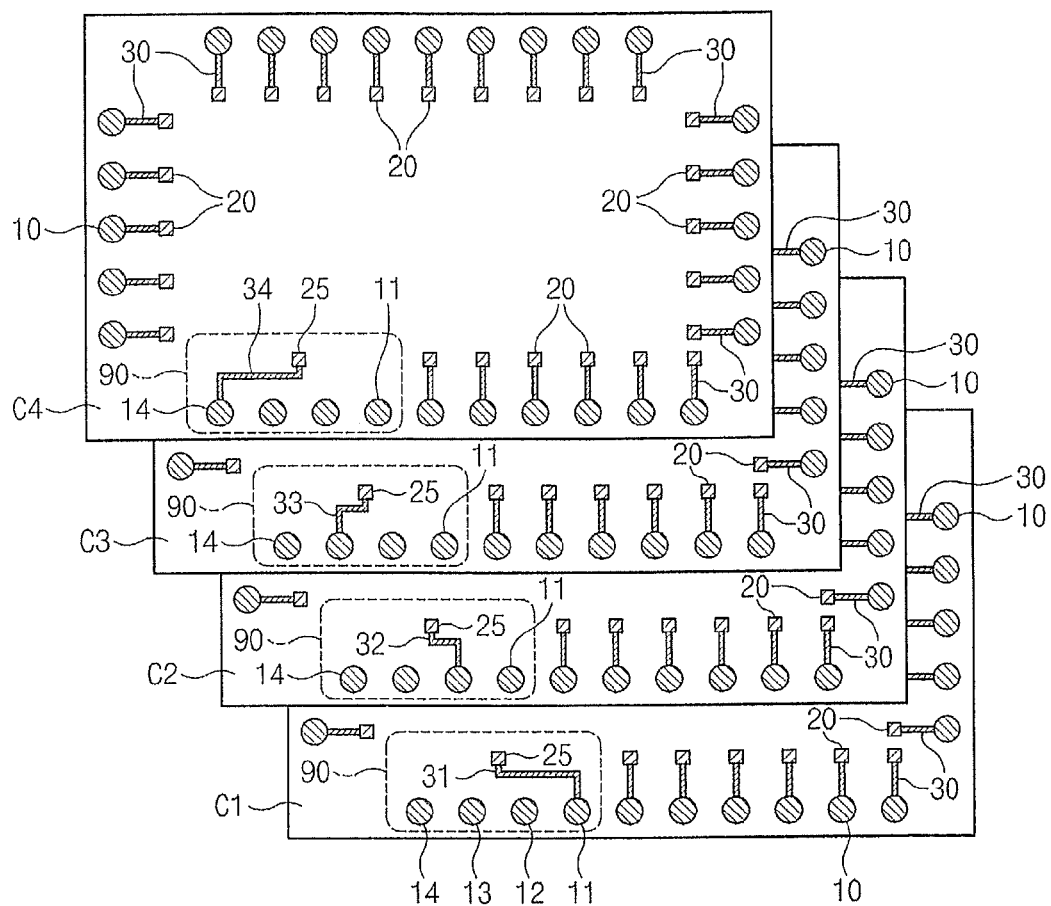
FIG. 1 is a plan view of a conventional Package-on-Package (PoP) having a chip selection unit.
Figure 2:
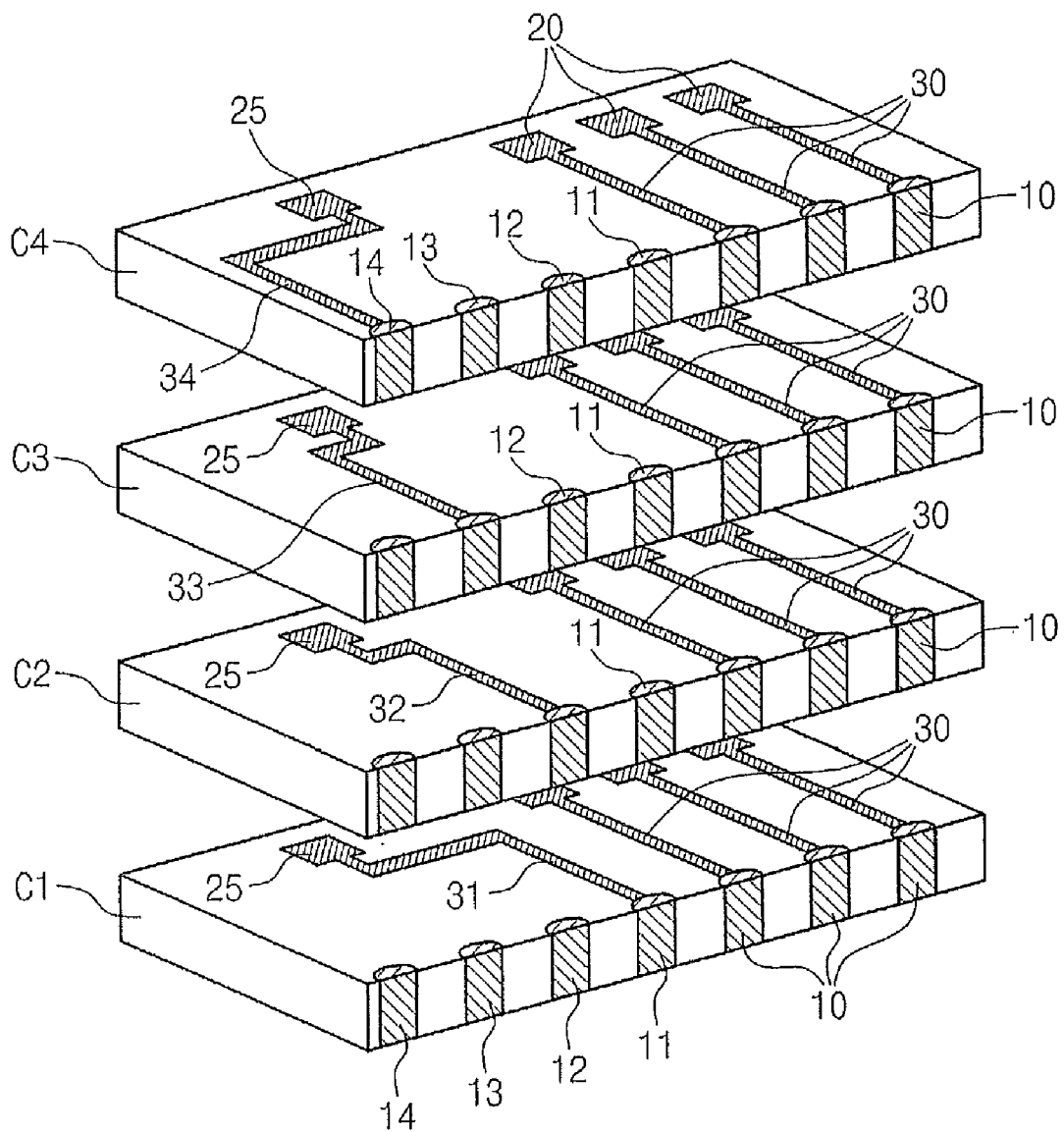
FIG. 2 is a perspective view of the conventional PoP having the chip selection unit shown in FIG. 1.

Reference will now be made in detail to the embodiments of the present invention, examples of which are illustrated in the accompanying drawings. However, the embodiments are not limited to the description provided below, and the embodiments herein are rather introduced to provide easy and complete understanding of the scope and spirit of the present invention.

It will also be understood that when a layer is referred to as being "on" another layer or substrate, it can be directly on the other layer or substrate, or intervening layers may also be present. In the drawings, the thicknesses of layers and regions are exaggerated for clarity. It will be understood that although the terms first and second are used herein to describe various regions, layers and/or sections should not be limited by these terms. These terms are only used to distinguish one region, layer or section from another region, layer or section. Thus, for example, a first layer discussed below could be termed a first layer without departing from the teachings of the present invention. Each embodiment described and illustrated herein includes complementary embodiments thereof.

FIGS. 3A through 5A are plan views illustrating an exemplary method of manufacturing a semiconductor package structure according to one embodiment. FIGS. 3B through 5B are perspective views of the exemplary method of manufacturing the semiconductor package structure shown in FIGS. 3A through 5A. Hereinafter, a semiconductor package structure including the same semiconductor chips, which have the same internal circuits, will be described. However, it will be appreciated that technical features related to a chip selection unit and a method of fabricating the same, which will be explained below, can be similarly applied to semiconductor package structures including semiconductor chips with different structures.

Figure 3A:
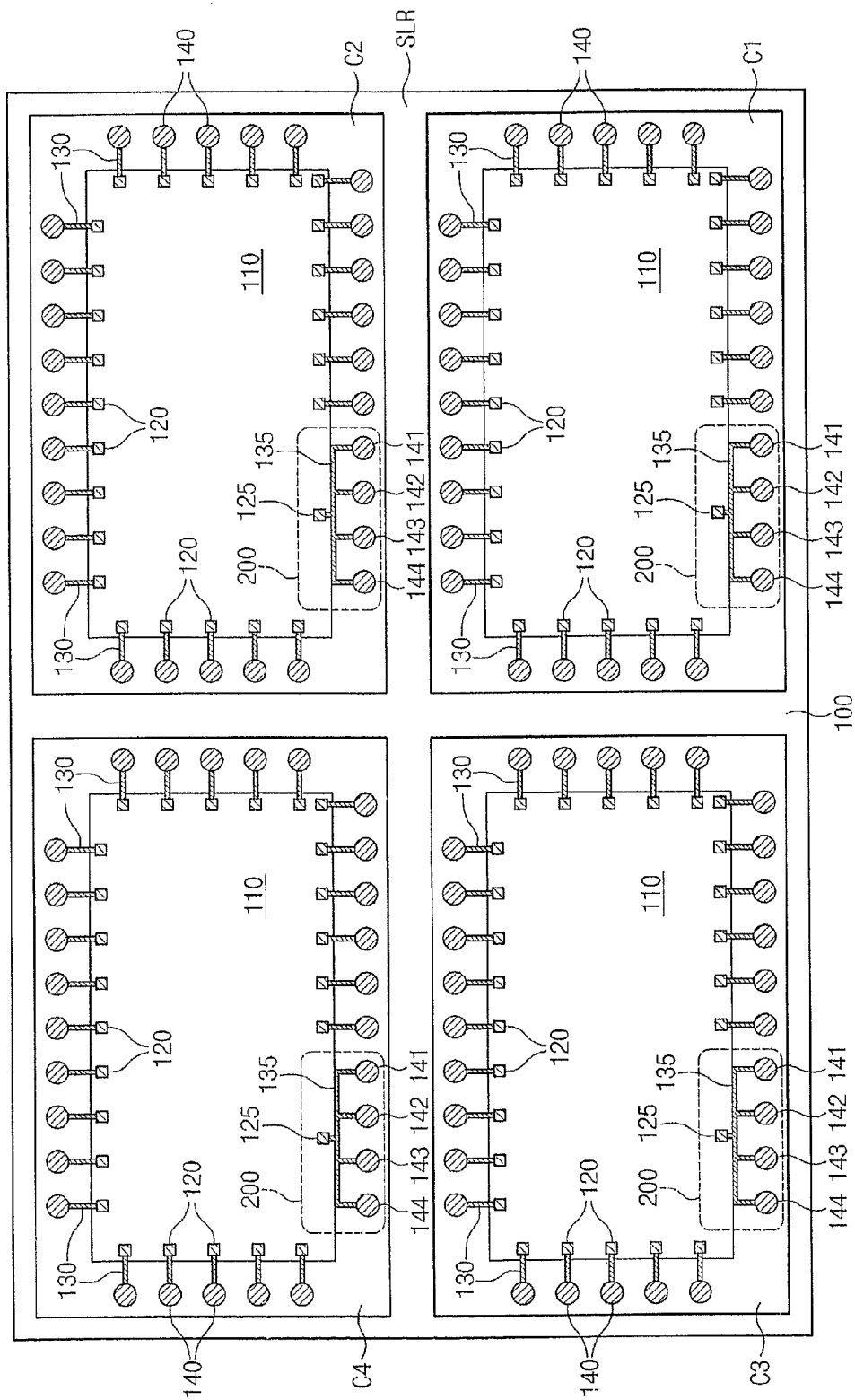
Figure 3B:
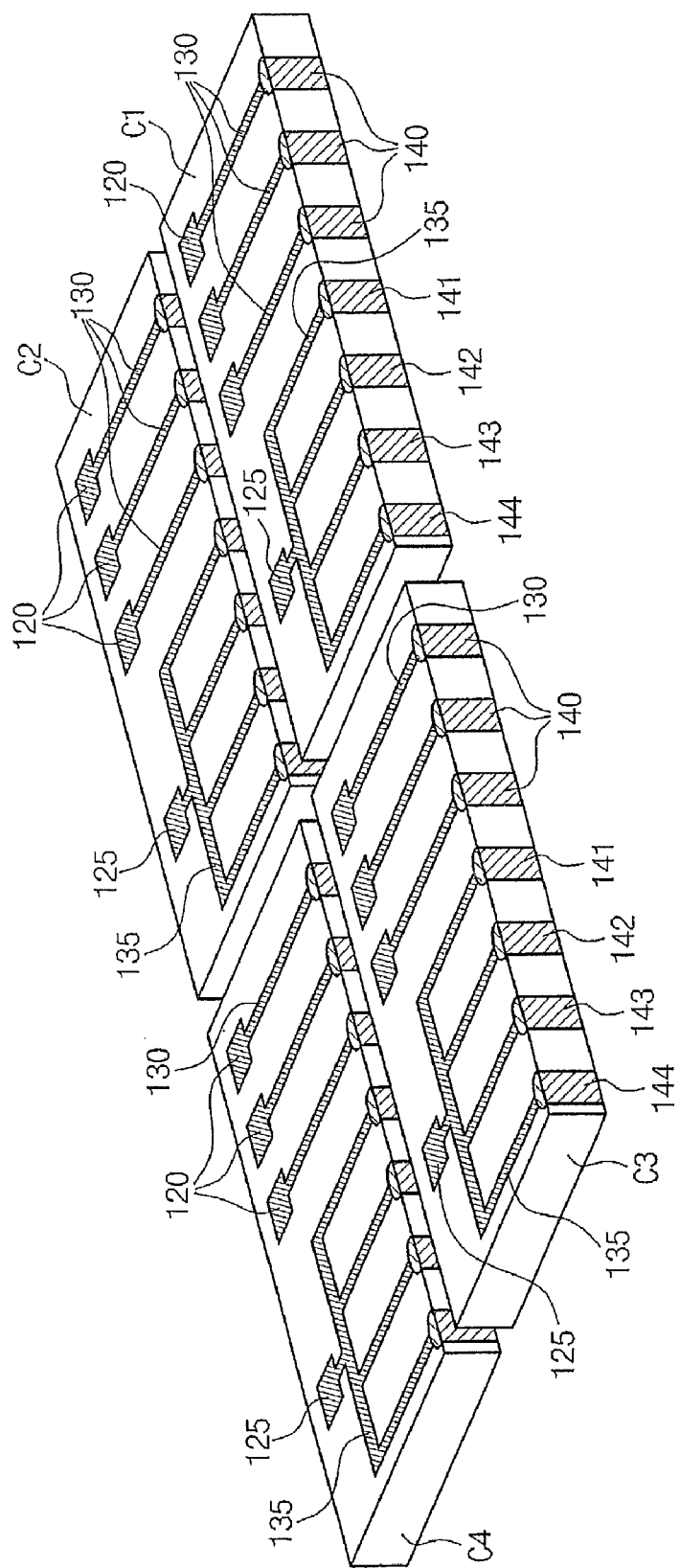

Referring to FIGS. 3A and 3B, a plurality of semiconductor chips C1, C2, C3, and C4, each of which includes an internal circuit 110, are formed on a wafer 100 (e.g., a semiconductor substrate). A scribe lane region SLR, which can be cut during a subsequent dicing process to separate the semiconductor chips C1 to C4, is formed between the semiconductor chips C1 to C4.

Each of the semiconductor chips C1 to C4 includes a chip selection pad 125 and chip pads 120 connected to the internal circuit 110. In one embodiment, the chip pads 120 function as input/output (I/O) terminals used for operating the internal circuit 110. The chip pads 120 of each of the semiconductor chips C1 to C4 are connected in parallel to a vertical interconnection line formed by through-vias 140. In one embodiment, the chip pads 120 and the chip selection pad 125 on each of the semiconductor chips C1 to C4 may be formed in the same processes. Accordingly, the chip pads 120 and the chip selection pad 125 may be formed simultaneously on each of the semiconductor chips C1 to C4. In this sense, the chip selection pad 125 may be considered as one type of chip pad 120 or a predetermined chip pad 120. The chip selection pad 125 is connected to a chip selection circuit (not shown) that is configured to select a predetermined semiconductor chip. The chip selection circuit may be electrically connected to the internal circuit 110.

According to one embodiment, the semiconductor chips C1 to C4 are formed in the same fabrication process. As a result, the semiconductor chips C1 to C4 are formed to have substantially the same structure. For example, the semiconductor chips C1 to C4 may be semiconductor memory chips having substantially the same structure. However, as described above, the semiconductor chips C1 to C4 may be semiconductor devices having different structures, which are fabricated through different fabrication processes.

Thereafter, through holes (see, e.g., 105 in FIG. 6) are formed through the wafer 100. The through holes 105 may be formed in a region (hereinafter, a "peripheral region") disposed around another region (hereinafter, a "chip region") where the internal circuits 110 are formed. It will be appreciated, however, that positions of the through holes 105 may be variously changed according to the structure and type of the semiconductor chips C1 to C4.

Through-vias 140 to 144 are formed to fill the through holes 105 and redistribution structures 130 are formed to electrically connect at least one through-via 140 with at least one chip pad 120. Through-vias 141 to 144 are used to select a predetermined semiconductor chip and will hereinafter be referred to as "chip selection vias". In one embodiment, while forming the redistribution structures 130, chip selection interconnection layers 135 may be formed. That is, the redistribution structures 130 and the chip selection interconnection layers 135 may be formed simultaneously. The chip selection interconnection layers 135 are electrically connected to first to fourth chip selection vias 141 to 144. According to the embodiments exemplarily described herein, a chip selection unit 200 may include the aforementioned chip selection vias 141 to 144, chip selection interconnection layer 135, and chip selection pad 125. In one embodiment, the chip selection units 200 have the substantially same plane arrangement irrespective of the stacked order of each of the semiconductor chips C1 to C4. That is, a relative location of a chip selection unit 200 within one semiconductor chip C1 to C4 may be substantially the same as a relative location of a chip selection unit 200 within any other semiconductor chip C1 to C4.

Figure 6:
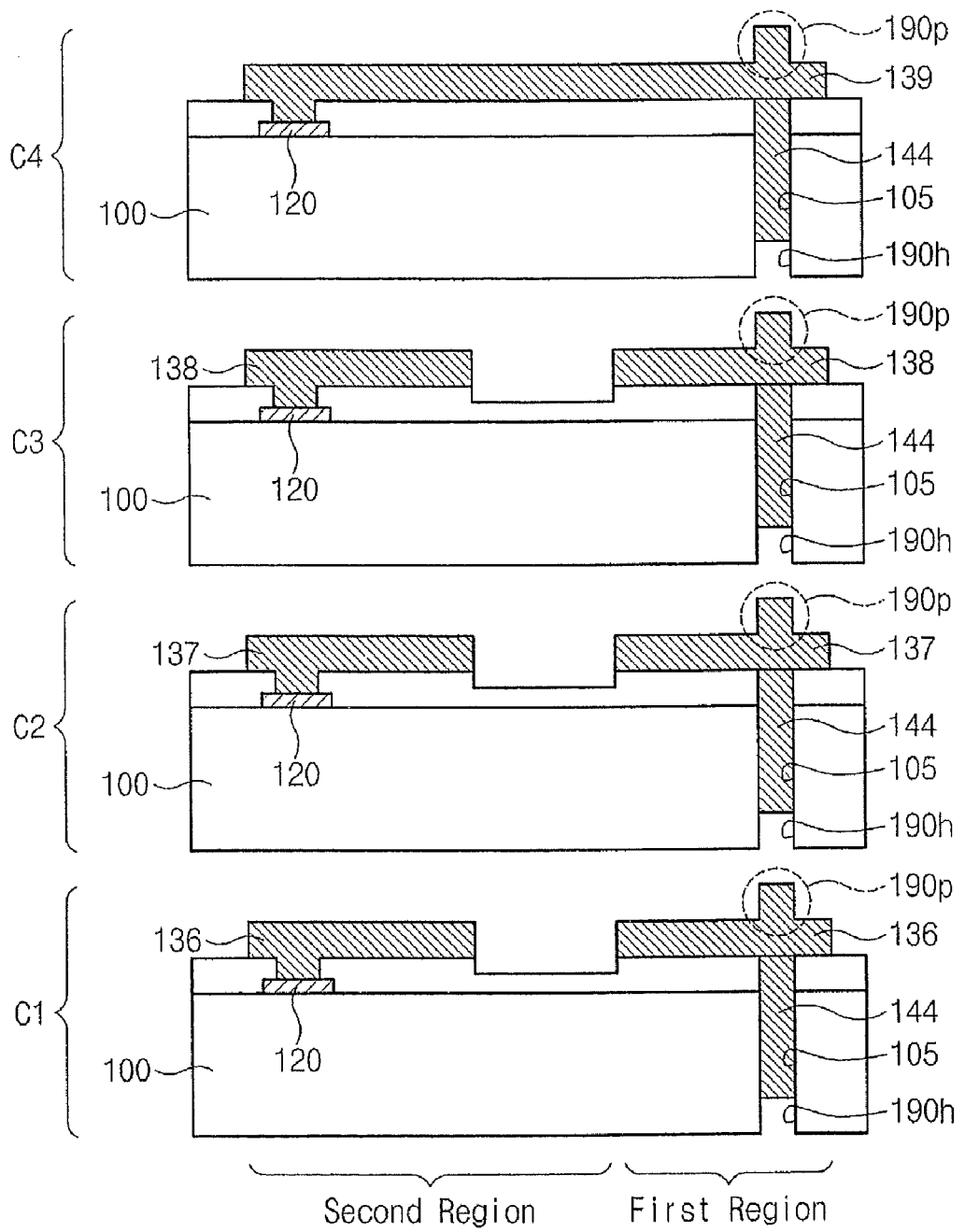
FIG. 6 is a cross-sectional view of the semiconductor package structure according to one embodiment, taken along line I-I' shown in FIG. 5B.
Figure 7:
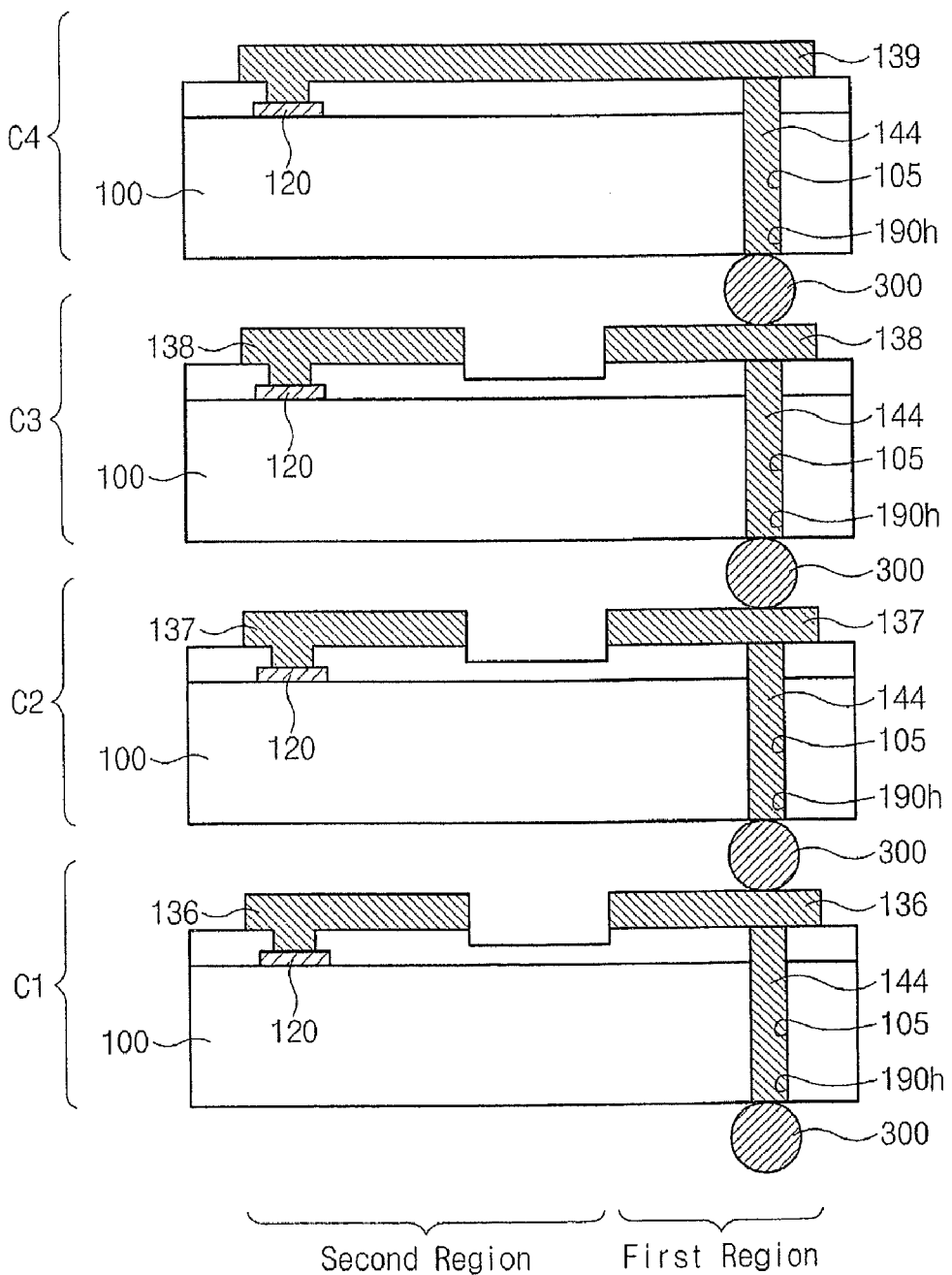
FIG. 7 is a cross-sectional view of the semiconductor package structure according to another embodiment, taken along line I-I' shown in FIG. 5B.

According to an embodiment, the formation of the redistribution structure 130 and the chip selection interconnection layer 135 may include forming a redistribution layer (not shown) on the resultant structure having the through-vias 140 to 144 and patterning the redistribution layer. In one embodiment, the redistribution layer may be a multilayered thin layer and the redistribution structure 130 may be formed using a one-time patterning process. As a result of the one-time patterning process, an upper sidewall of the redistribution structure 130 may be substantially vertically aligned with a lower sidewall thereof, as illustrated in FIGS. 6 and 7. That is, the redistribution structure 130 and the chip selection interconnection layer 135 may have substantially vertical sidewalls.

According to another embodiment, the through-vias 140 to 144, the redistribution structure 130, and the chip selection interconnection layer 135 can be formed at the same time. U.S. patent application Ser. No. 11/750,663 which was filed on May 18, 2007 and corresponds to Korean Patent Application No. 2006-45801, the disclosure of which is hereby incorporated by reference herein in its entirety, discloses a semiconductor package including through-vias and a method of fabricating the same. Accordingly, the method disclosed in Korean Patent Application No. 2006-45801 can also be applied to embodiments exemplarily described herein.

According to an embodiment, the number of the chip selection vias 141 to 144 is equal to the number of the stacked semiconductor chips C1 to C4. Also, the chip selection interconnection layer 135 connects all the chip selection vias 141 to 144 to the chip selection pad 125. According to some embodiments, the chip selection interconnection layers 135 of all the semiconductor chips C1 to C4 may have substantially the same structure. For example, the chip selection interconnection layers 135 may have substantially the same 2-dimensional arrangement within each of the semiconductor chips C1 to C4, when viewed in plan view. Thus, when the semiconductor chips C1 to C4 have substantially the same structure, the chip selection interconnection layer 135 and the redistribution structure 130 can be formed using the same photo mask irrespective of the stacked order of each of the semiconductor chips C1 to C4. Compared with the conventional art, in which a plurality of photo masks are needed depending on the stacked order of semiconductor chips, the embodiments described herein can reduce costs associated with packaging the semiconductor chips.

Figure 8:
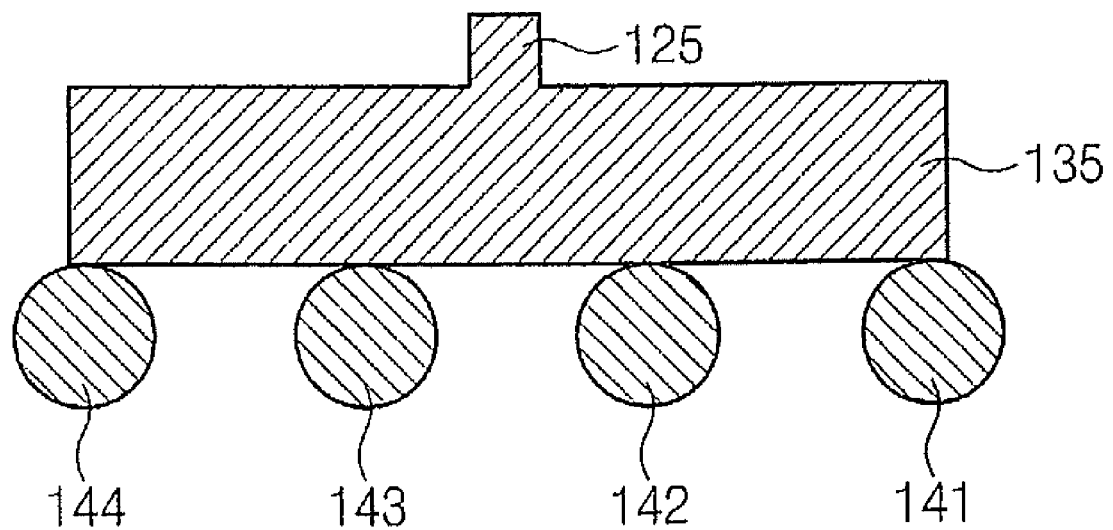
FIG. 8 is a plan view of a chip selection interconnection layer according to one embodiment.

As illustrated in FIG. 3A, each of the chip selection interconnection layers 135 may be comb-shaped, having a plurality of branches connected to the chip selection vias 141 to 144, respectively. It will be appreciated, however, that the shape of the chip selection interconnection layer 135 may be variously changed as long as the chip selection interconnection layer 135 connects all of the chip selection vias 141 to 144 to the chip selection pad 125. For example, the chip selection interconnection layer 135 may have a rectangular shape as illustrated in FIG. 8.

Figure 4A:
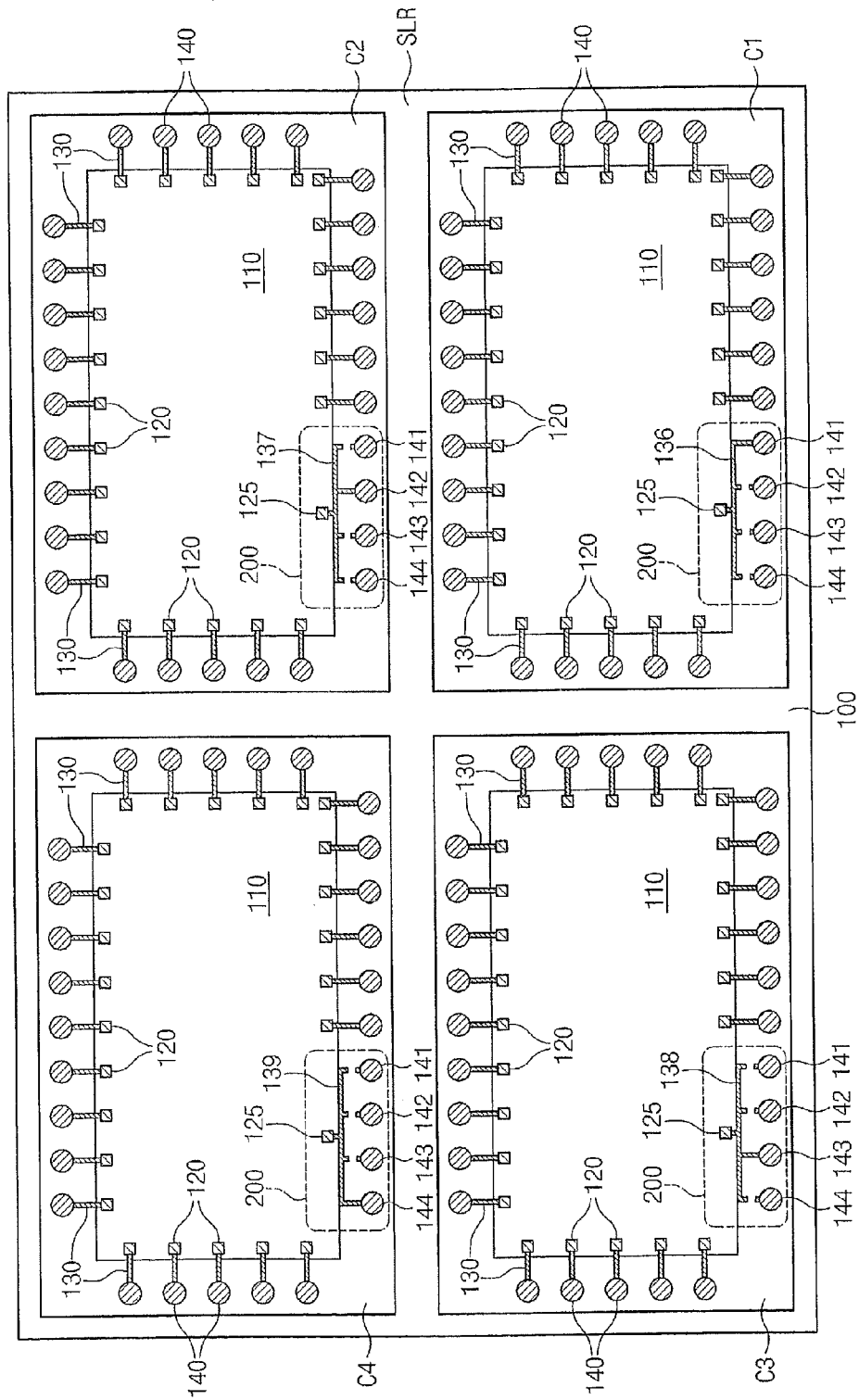
Figure 4B:
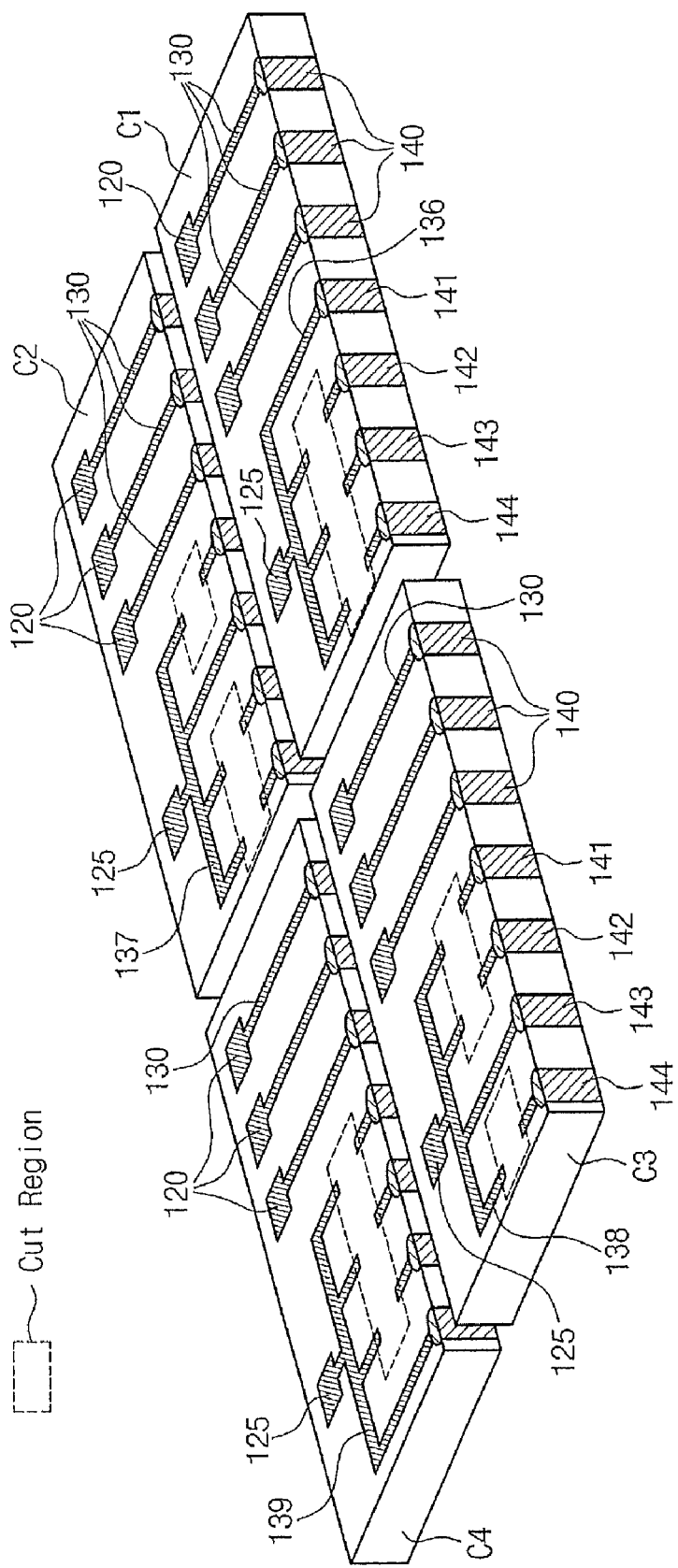

Referring to FIGS. 4A and 4B, the chip selection units 200 are patterned. In one embodiment, the chip selection units 200 are formed by patterning the chip selection interconnection layers 135 to form chip selection interconnection lines 136, 137, 138, and 139. The chip selection interconnection lines 136 to 139 may have different structures according to the stacked order of the respective semiconductor chips C1 to C4. On the other hand, the physical configuration of the redistribution structures 130 remains substantially unchanged from before the chip selection interconnection layers 135 are patterned to after the chip selection interconnection layers 135 are patterned. That is, a physical configuration of the redistribution structures 130 before patterning the chip selection interconnection layers 135 is substantially the same as the physical configuration of the redistribution structures 130 after patterning the chip selection interconnection layers 135.

In one embodiment, the chip selection interconnection layer 135 is patterned such that the chip selection interconnection lines 136 to 139 are connected to different chip selection vias 141 to 144, respectively, according to the stacked order of each of the semiconductor chips C1 to C4. For example, as illustrated in FIGS. 4A and 4B, the chip selection interconnection line 136 of the first semiconductor chip C1 is formed to connect the chip selection pad 125 of the first semiconductor chip C1 with only the first chip selection via 141 of the first semiconductor chip C1 and the chip selection interconnection line 137 of the second semiconductor chip C2 is formed to connect the chip selection pad 125 of the second semiconductor chip C2 with only the second chip selection via 142 of the second semiconductor chip C2. Similarly, the chip selection interconnection line 138 of the third semiconductor chip C3 is formed to connect the chip selection pad 125 of the third semiconductor chip C3 with only the third chip selection via 143 of the third semiconductor chip C3 and the chip selection interconnection line 139 of the fourth semiconductor chip C4 is formed to connect the chip selection pad 125 of the fourth semiconductor chip C4 with only the fourth chip selection via 144 of the fourth semiconductor chip C4. Thus, the chip selection interconnection lines 136 to 139 may be electrically connected to the aforementioned chip selection circuit to connect the chip selection pads 125 to the chip selection circuit.

In one embodiment, the chip selection interconnection layers 135 are patterned to form chip selection interconnection lines 136, 137, 138, and 139 by removing portions of the chip selection interconnection layer 135 of each chip selection unit 200, thereby forming cut regions within each of the chip selection units 200. Due to the cut regions, each of the chip selection interconnection lines 136 to 139 may be divided into a first region connected to the corresponding one of the first to fourth chip selection vias 141 to 144 and a second region that connects the chip selection pad 125 with the first region. In one embodiment, a second region may connect a chip selection pad 125 with one or more first regions such that at least one of the first regions is not connected to the chip selection pad 125.

The chip selection interconnection layer 135 may be patterned by removing a predetermined region of the chip selection interconnection layer 135. In one embodiment, the predetermined region of the chip selection interconnection layer 135 may be removed using a laser cutting technique, a laser drilling technique, a dry etching technique, a wet etching technique, a local heating technique, or the like or a combination thereof.

Figure 5A:
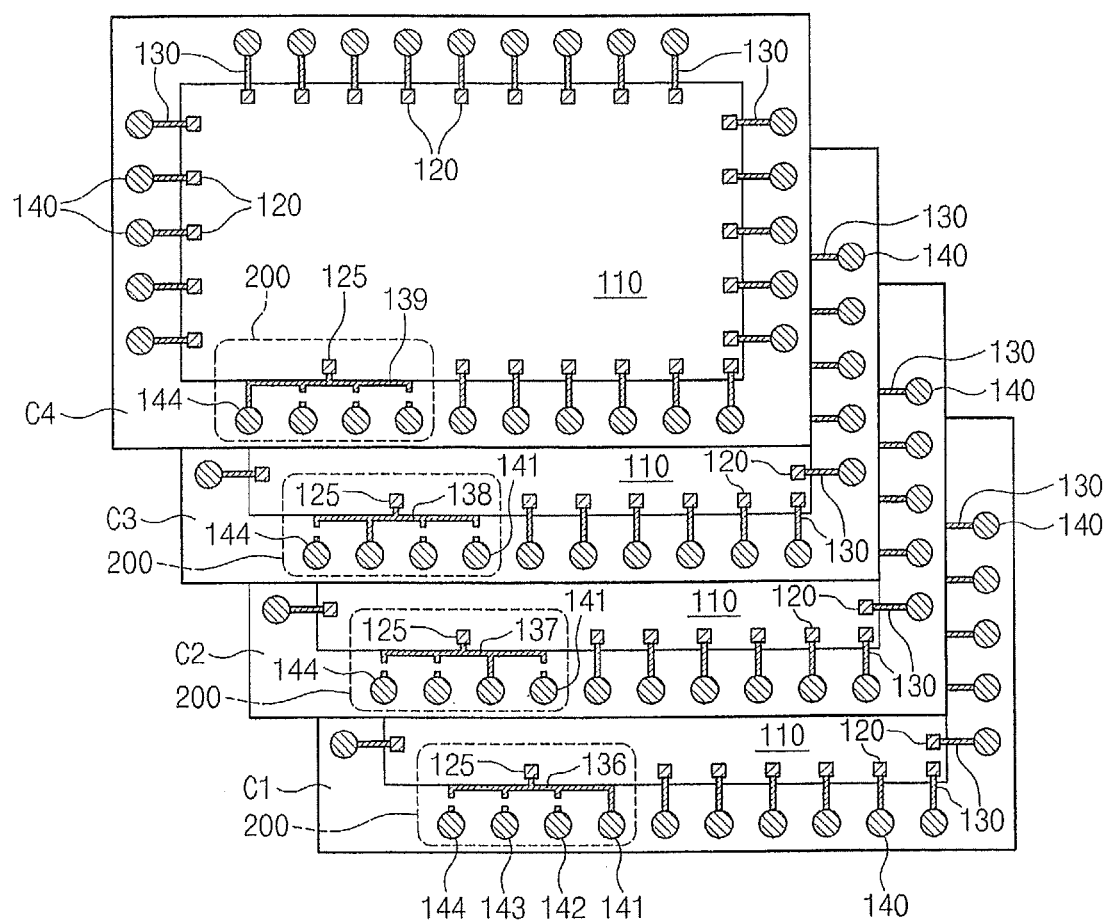
Figure 5B:
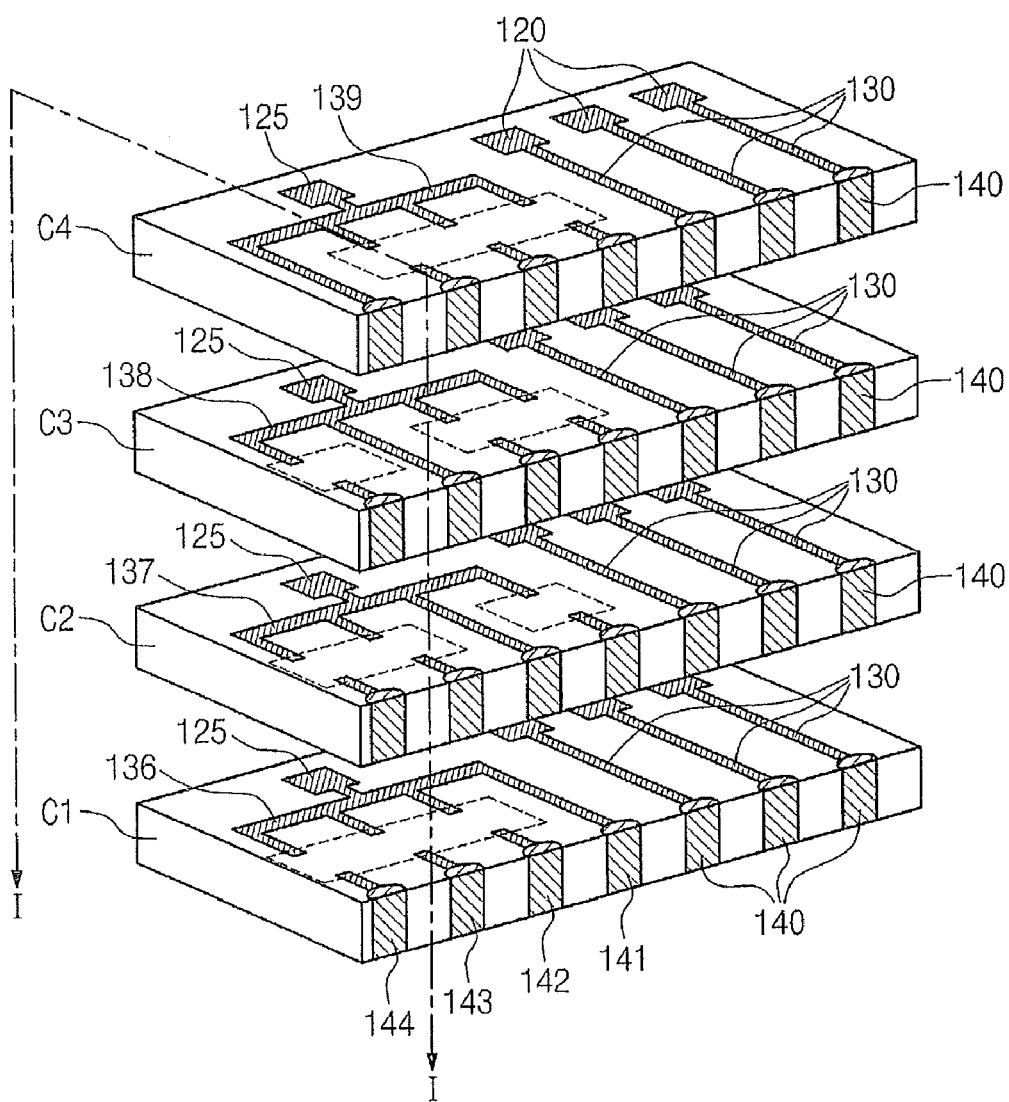

Referring to FIGS. 5A and 5B, the plurality of semiconductor chips C1 to C4 are separated from the wafer 100 having the chip selection interconnection lines 136 to 139 using a dicing process. The dicing process includes, for example, cutting the wafer 100 along the scribe lane region SLR between the semiconductor chips C1 to C4.

Thereafter, the separated semiconductor chips C1 to C4 are sequentially stacked such that the separated semiconductor chips C1 to C4 are electrically connected to one another by the through-vias 140 to 144. The separated semiconductor chips C1 to C4 can be electrically connected to one another in various manners, as will be exemplarily described below with respect to FIGS. 6 and 7.

FIG. 6 is a cross-sectional view of the semiconductor package structure according to one embodiment, taken along line I-I' shown in FIG. 5B, FIG. 7 is a cross-sectional view of the semiconductor package structure according to another embodiment, taken along line I-I' shown in FIG. 5B.

Referring to FIG. 6, each of the through-vias 140 to 144 may include a protrusion 190p that protrudes from a top surface of each of the semiconductor chips C1 to C4. Moreover, a groove 190h may be formed in a bottom surface of each of the semiconductor chips C1 to C4. In one embodiment, the protrusion 190p and the groove 190h are substantially aligned along the central axis of each of the through holes 105. Thus, the separated semiconductor chips C1 to C4 can be connected to one another by inserting the protrusion 190p of one semiconductor chip into the groove 190h of another semiconductor chip.

In one embodiment, the protrusion 190p is formed so as to protrude above top surfaces of the redistribution structures 130 and be electrically connected to the through-vias 140. As exemplarily shown in FIG. 6, protrusions 190p may also be formed so as to protrude above top surfaces of the chip selection interconnection lines 136 to 139 in the first regions thereof and be electrically connected to the through-vias 141 to 144, respectively. As also shown in FIG. 6, semiconductor chips C1 to C3 have cut regions between the first and second regions. These cut regions may be formed during the patterning of the chip selection layers 135.

Referring to FIG. 7, the separated semiconductor chips C1 to C4 may be electrically connected to one another using solder balls 300. As exemplarily illustrated, after separating the semiconductor chips C1 to C4 from the wafer 100, the solder balls 300 are formed to be connected to the through-vias 140 to 144 under the semiconductor chips C1 to C4.

According to the embodiments exemplarily described above, semiconductor chips having chip selection interconnection layers with the substantially the same structure are formed. Thus, redistribution structures and chip selection layers can be formed using the same photo mask, irrespective of the stacked order of each of the semiconductor chips. As a result, costs associated with packaging the semiconductor chips can be reduced.

As also exemplarily described above, the chip selection interconnection layer is commonly connected to a plurality of chip selection vias, but the chip selection interconnection layer is selectively patterned considering the stacked order of each of the semiconductor chips during a final packaging operation. Accordingly, the structure of a chip selection unit in a final process of stacking the semiconductor chips—not in the process of designing the semiconductor chips. Due to such flexibility of the structure of the chip selection unit, the structure of the chip selection unit can be easily changed as necessity requires. As a result, the cost and time associated with packaging the semiconductor chips can be reduced.

According to the embodiments exemplarily described above, a method of fabricating a semiconductor package structure in which the structure of a chip selection unit is completed before stacking semiconductor chips. The method includes forming semiconductor chips on a semiconductor substrate. Each of the semiconductor chips includes chip pads. Through vias are formed through the semiconductor chips. Redistribution structures are formed on the semiconductor chips, respectively. Each of the redistribution structures includes a chip selection interconnection layer and connects the through vias with the chip pads. The chip selection interconnection layers are patterned to form chip selection interconnection lines having different structures on at least one of the semiconductor chips. The semiconductor chips are stacked and electrically connected using the through vias. In view of the above, the structure of a chip selection unit is completed before stacking semiconductor chips.

The formation of the redistribution structures may include forming the chip selection interconnection layers to have substantially the same plane arrangement.

In an embodiment, the stacked semiconductor chips are formed using the same fabrication process to have substantially the same structure. Before patterning the chip selection interconnection layers, the redistribution structures of the semiconductor chips may be formed to have substantially the same structure. However, the chip selection interconnection lines, which are obtained by patterning the chip selection interconnection layers, may be formed on the semiconductor chips to have different structures.

In an embodiment, the redistribution structure may be formed to electrically connect at least one of the chip pads with at least one of the through-vias, and at least one of the chip pads may function as a chip selection pad used to select one of the semiconductor chips. In this case, the chip selection interconnection layer may be formed to connect the chip selection pad with a plurality of through-vias. Meanwhile, the number of the through-vias connected by the chip selection pad may be equal to the number of the stacked semiconductor chips.

Furthermore, the formation of the chip selection interconnection line may include electrically isolating a predetermined through-via from the chip selection pad by removing a predetermined region of the chip selection interconnection layer between the chip selection pad and the through-vias connected to the chip selection pad. The removal of the predetermined region of the chip selection interconnection layer may be performed using at least one selected from the group consisting of a laser cutting technique, a laser drilling technique, a dry etching technique, a wet etching technique, and a local heating technique.

In an embodiment, each of the semiconductor chips may include a chip region having an internal circuit electrically connected to the chip pads and a peripheral region located around the chip region. In this case, the chip selection interconnection layer may be formed on the peripheral region.

In an embodiment, each of the through-vias may be formed to have a protrusion protruding from one surface of the semiconductor chip and a groove recessed in the other surface of the semiconductor chip. In this case, the stacking of the semiconductor chips may include inserting the protrusion of one semiconductor chip into the groove of another semiconductor chip.

In another embodiment, the stacking of the semiconductor chips may include: forming solder balls under the through-vias, respectively; and electrically connecting the through-vias of one semiconductor chip with the through-vias of another semiconductor chip using the solder balls.

In an embodiment, the formation of the redistribution structure may include forming a redistribution layer on the semiconductor chip; and forming the redistribution structure by patterning the redistribution layer. In this case, the patterning of the redistribution layer may be performed using a one-time patterning process.

According to another embodiment, there is provided a semiconductor package structure in which a predetermined region of a chip selection unit is cut. The structure includes semiconductor chips that are stacked sequentially, and each of the semiconductor chips includes chip pads connected to an internal circuit. Through-vias are formed through the semiconductor chips. Redistribution structures are disposed on the semiconductor chips, respectively. Each of the redistribution structures electrically connects at least one of the chip pads with at least one of the through-vias. Each of the redistribution structures includes a chip selection interconnection line used to select one of the semiconductor chips. The chip selection interconnection line includes: first regions connected to the through-vias, respectively; and a second region for connecting at least one of the first regions with the chip pad. In this case, at least one of the first regions is not electrically connected to the chip pad.

In an embodiment, the redistribution structure may be formed using a one-time patterning process such that a lower sidewall of the redistribution structure is substantially aligned with an upper sidewall of the redistribution structure.

It will be apparent to those skilled in the art that various modifications and variations can be made to the embodiments exemplarily described herein. Thus, it is intended that the present invention covers the modifications and variations of the embodiments exemplarily described herein, provided they come within the scope of the appended claims and their equivalents.

That which is claimed is:

1. A semiconductor package comprising:
    semiconductor chips, wherein the semiconductor chips are stacked and each semiconductor chip includes respective chip pads connected to an internal circuit;
    through-vias extending through each of the semiconductor chips;
    redistribution structures on each of the semiconductor chips, at least one of the redistribution structures electrically connecting at least one of the chip pads with at least one of the through-vias on each of the semiconductor chips; and
    chip selection interconnection lines on each of the semiconductor chips, wherein the chip selection interconnection lines of each chip comprise:
    first regions electrically connected to a corresponding number of the through-vias; and
    a second region electrically connected to at least one of the first regions with a predetermined one of the chip pads,
    wherein at least one of the first regions is not electrically connected to the predetermined one of the chip pads.

2. The semiconductor package according to claim 1, wherein:
    redistribution structures on one of the semiconductor chips have substantially a same physical configuration as redistribution structures on another one of the semiconductor chips; and
    chip selection interconnection lines on one of the semiconductor chips have a different physical configuration from those on another one of the semiconductor chips.

3. The semiconductor package according to claim 1, wherein at least one of the redistribution structures includes a lower sidewall and an upper sidewall, and wherein the lower sidewall is substantially aligned with the upper sidewall.

4. The semiconductor package according to claim 1, further comprising:
    a protrusion electrically connected to at least one of the through-vias, the protrusion protruding above a surface of at least a first one of the semiconductor chips; and
    a groove within another surface of at least a second one of the semiconductor chips,
    wherein the protrusion of the first one of the semiconductor chips is inserted into the groove of the second one of the semiconductor chips.

5. The semiconductor package according to claim 1, further comprising a solder ball under at least one of the through-vias, wherein through-vias of at least two of the semiconductor chips are electrically connected to one another by the solder ball.

6. The semiconductor package according to claim 1, wherein at least one of the semiconductor chips comprises a chip region having an internal circuit electrically connected to the respective chip pads and a peripheral region located outside the chip region, wherein the at least one first region not electrically connected to the predetermined one of the chip pads is in the peripheral region.

7. The semiconductor package according to claim 1, wherein a number of the first regions is equal to a number of the semiconductor chips that are stacked.

* * * * *